(12) United States Patent
Liken et al.

(10) Patent No.: US 6,984,974 B2
(45) Date of Patent: Jan. 10, 2006

(54) INDEPENDENTLY-ADJUSTABLE CIRCUIT BOARD CARRIER

(75) Inventors: Peter A. Liken, West Olive, MI (US); Darin E. Immink, Holland, MI (US)

(73) Assignee: Venturedyne, Ltd., Milwaukee, WI (US)

( * ) Notice: Subject to any disclaimer, the term of this patent is extended or adjusted under 35 U.S.C. 154(b) by 6 days.

(21) Appl. No.: 10/715,075

(22) Filed: Nov. 17, 2003

(65) Prior Publication Data

US 2005/0106926 A1 May 19, 2005

(51) Int. Cl.
*H05K 1/00* (2006.01)
*H01K 1/14* (2006.01)

(52) U.S. Cl. ............... 324/158.1; 361/796; 211/41.17; 269/903

(58) Field of Classification Search .................. None
See application file for complete search history.

(56) References Cited

U.S. PATENT DOCUMENTS

| | | | |
|---|---|---|---|
| 3,184,069 A * | 5/1965 | Rosenberg ............... 211/41.17 |
| 4,124,878 A * | 11/1978 | Ebner et al. ................ 361/802 |
| 4,683,424 A | 7/1987 | Cutright et al. |
| 4,986,778 A | 1/1991 | Liken et al. |
| 5,268,637 A | 12/1993 | Liken et al. |
| 5,383,793 A * | 1/1995 | Hsu et al. ................... 439/327 |
| 5,406,452 A * | 4/1995 | Uchiumi ..................... 361/727 |
| 5,528,161 A | 6/1996 | Liken et al. |
| 5,603,628 A * | 2/1997 | Schapiro, Jr. ............... 439/327 |
| 5,822,193 A * | 10/1998 | Summers et al. ........... 361/759 |
| 6,183,284 B1 * | 2/2001 | Gill et al. ................... 439/327 |
| 6,331,940 B1 * | 12/2001 | Lin ............................ 361/785 |
| 6,373,270 B1 | 4/2002 | Cochran et al. |
| 6,462,532 B1 | 10/2002 | Smith |
| 6,714,419 B2 * | 3/2004 | Liken et al. ................ 361/752 |

* cited by examiner

*Primary Examiner*—Paresh Patel
(74) *Attorney, Agent, or Firm*—Jansson, Shupe, Munger & Antaramian, Ltd.

(57) ABSTRACT

A carrier of circuit boards includes a base frame having a plurality of first card guides disposed on its upper surface, the first card guides for securing respective first side edges of a corresponding plurality of circuit boards, a plurality of second card guides for securing respective second side edges of the plurality of circuit boards, and a plurality of adjustment members, each being for individually adjusting a distance between a respective pair of one first card guide and one second card guide. A method of preparing a carrying arrangement for a plurality of circuit boards includes providing a carrier for the plurality of circuit boards. Groups of circuit boards having different vertical on-edge dimensions may be interconnected and/or tested by being placed together and individually snugly held on a single carrier shelf.

15 Claims, 3 Drawing Sheets

INDEPENDENTLY-ADJUSTABLE CIRCUIT BOARD CARRIER

BACKGROUND

1. Field of the Invention

The invention relates to manufacturing and testing processes and, more particularly, to improved apparatus for carrying of circuit boards.

2. Background of the Invention

Printed circuit boards carrying electronic and related components are typically produced in a fashion where per-unit cost is a factor to be minimized. Circuit boards may be produced in a high volume manufacturing where any incremental advantage in processing of the circuit boards can effect substantial benefits for the manufacturer. In a typical processing, a bare circuit board may be pretested for continuity, stuffed with components and soldered, cleaned, functionally tested and visually inspected, burned-in according to various criteria, tested, assembled into an assembly, retested, etc. By improving any of the individual processes, a large benefit may result, such as higher yields, lower rework, etc. One such manufacturing advantage may be realized by considering simple quality control logistics and the effects of implementing known testing techniques. Such manufacturing and testing may include handling circuit boards by use of a circuit board carrier.

Many quality control and like methods used in manufacturing are adapted for processing and testing of assembled circuit boards. For example, a failure occurring when a component is first operated may be referred-to as an "infant mortality" that happens during a "burn-in" period. By way of over-simplified example, say a component of a circuit board has a 80% chance of meeting required specifications after an initial operation period. And, in this example, if there are three '80% good' components installed in a circuit board, the likelihood of obtaining a working circuit board becomes (0.80×0.80×0.80)51.2%. If the same three components are each '99% good,' the likelihood of obtaining a working circuit board having the three components becomes (0.99×0.99×0.99)97%. A general rule of thumb is that a cost of culling out failed components increases ten-fold for each successive manufacturing process step. Therefore, it makes sense to efficiently test each component to assure the component is near 100% good, before installing the component in the circuit board. The same principle applies to assembled circuit boards as components of a larger system. Performing testing and various cycling on individual circuit boards is necessary to identify rejects. Such processing should be efficient for reducing manufacturing costs while still optimizing quality. For example, by utilizing a circuit board carrier, various fixturing and handling problems may be simplified. Providing thorough testing of individual circuit boards, before they are installed in a larger piece of equipment, assures higher yield for a final assembly line.

When a circuit board has been stuffed, assembled, soldered, cleaned, tested, visually inspected, etc., the assembled circuit board may be calibrated and functionally tested, for example, by placing the unit under test into a simulation or functional test apparatus. At a convenient point in the manufacturing/testing process, the circuit boards may be loaded into a circuit board carrier. The circuit boards that pass inspection may be loaded via the carrier into an environmental chamber where they are each connected to a load, powered-up, and subjected to increased and/or reduced temperature, humidity, vibration, and other stimuli in a 'shock cycling' that accelerates the process of infant mortality. Such cycling may include monitoring certain electrical operating characteristics while the circuit board is undergoing extreme changes in temperature or other environmental parameter. A range for temperature or other cycling parameters typically depends on an intended use for an end product, e.g., consumer goods, military products, etc. For example, consumer type electrical products may have environmental or reliability requirements determined by a regulating agency such as UL, CSA, NEMA, etc. By comparison, a military product having a circuit board may be required to withstand a more intensive burn-in and testing phase, for example by subjecting the circuit board to more extreme temperature shock cycles, vibration, etc. Many potential defects are heat related or a result of a mechanical defect such as a loose wire, and such failures are more likely to occur or manifest themselves by use of such burn-in test cycling, whereupon the defective circuit boards are culled out and reworked or scrapped. In addition, since circuit components are required to interact within a circuit board, the combined functionality of the circuit as a whole is also stressed by the environmental cycling. Circuit boards that survive the environmental testing are more likely to perform successfully in the end product for years to come.

Due to the complexity and number of components in most circuit boards, it is usually required to perform thorough testing, wherein carriers are used for handling and electrical hookups. It is typically highly advantageous to increase the circuit board yield percentage even slightly.

Various kinds of testing may be performed on circuit boards by attaching loads and by doing 'live' functional testing either separately or in combination with the environmental cycling. Carriers typically support the circuit boards on edge in a parallel spaced-apart relation and may include electrical connectors for engaging the circuit boards. A carrier may have electrical connectors for electrically connecting the carrier, and its individual circuit boards, to an external device including, for example, a power source, current meter, fuse, signal generator, logic circuit, data collection device, etc. While such carriers generally facilitate efficient manufacturing, they are not adaptable for being easily customized.

OBJECTS OF THE INVENTION

It is an object of the invention to provide an improved circuit board carrier overcoming some of the problems and shortcomings of the prior art, including those referred to above.

Another object of the invention is to provide a test system adaptable to being customized for testing of circuit boards having different geometries and dimensions.

Another object of the invention is to provide a circuit board test/burn-in system readily adaptable for testing of groups of circuit boards, including groups of circuit boards interacting with one another, for example, by operating in a master-slave relation.

Still another object of the invention is to provide a system for securing multiple size circuit boards per carrier level.

Yet another object of the invention is to provide a carrier having independent card guide adjustment at each position.

Another object of the invention is to provide a general carrier design that is adaptable for use of different mechanisms and for use of structure for customizing individual shelf locations.

How these and other objects are accomplished will become apparent from the following descriptions and the drawings.

SUMMARY OF THE INVENTION

In one aspect of the invention, a carrier of circuit boards includes a base frame having a plurality of first card guides disposed on its upper surface, the first card guides for securing respective first side edges of a corresponding plurality of circuit boards, a plurality of second card guides for securing respective second side edges of the plurality of circuit boards, and a plurality of adjustment members, each being for individually adjusting a distance between a respective pair of one first card guide and one second card guide.

In another aspect of the invention, a method of preparing an arrangement for testing of a plurality of circuit boards includes providing a carrier for the plurality of circuit boards, the carrier including a base frame having a plurality of first card guides disposed on its upper surface, the first card guides for securing respective first side edges of a corresponding plurality of circuit boards, a plurality of second card guides for securing respective second side edges of the plurality of circuit boards, and a plurality of adjustment members, each being for individually adjusting a distance between a respective pair of one first card guide and one second card guide.

In another aspect of the invention, a method includes securing a first circuit board having a first width in a first slot disposed on a surface of a carrier, and securing a second circuit board having a second width in a second slot disposed on the surface of the carrier and adjacent the first slot, the second width being different from the first width, where the securing provides card guides for abutting opposite edges of the first and second circuit boards.

In another aspect of the invention, a method includes providing a carrier having a single shelf for snugly carrying, on-edge, a plurality of circuit boards having respectively different on-edge vertical dimensions.

In another aspect of the invention, a carrier of circuit boards includes means for securing respective first side edges of a corresponding plurality of circuit boards, means for securing respective second side edges of the plurality of circuit boards, and adjustment means for individually adjusting a distance between a respective pair of one first card guide and one second card guide.

As a result of implementing the present invention, each individual circuit board being carried may be accommodated even though dimensions of circuit boards may vary. Individual circuit boards having different dimensions may be snugly secured in a carrier. Such allows for carrying any mixture of circuit boards, including circuit boards that are grouped for a particular reason. Accordingly, different circuit boards may be interconnected while being loaded onto a carrier, so that cooperation among a group of boards may be tested and/or used for self-adjustment, calibration, and other operations. The independently-adjustable circuit board carrier may be configured and adapted for virtually any circuit board processing environment and requirements. For example, the carrier may be easily customized for testing of different circuit boards having corresponding different geometries and dimensions.

Additional advantages and a more complete understanding of the present invention may be derived by referring to the detailed description of preferred embodiments and claims when considered in connection with the figures, wherein like reference numbers refer to similar items throughout the figures.

DETAILED DESCRIPTION OF PREFERRED EMBODIMENTS

Figure 1:
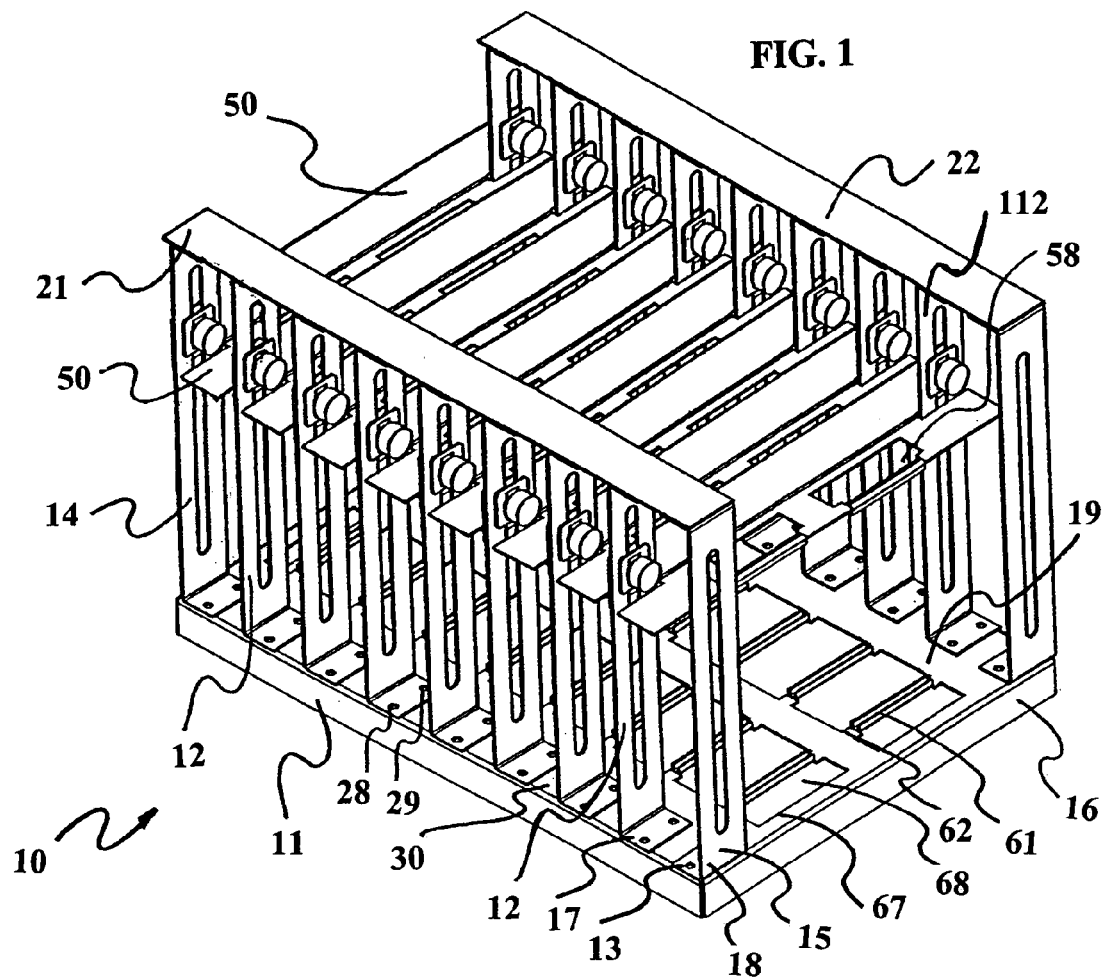
FIG. 1 shows a circuit board carrier having independently adjustable cells according to an exemplary embodiment of the invention.
Figure 2:
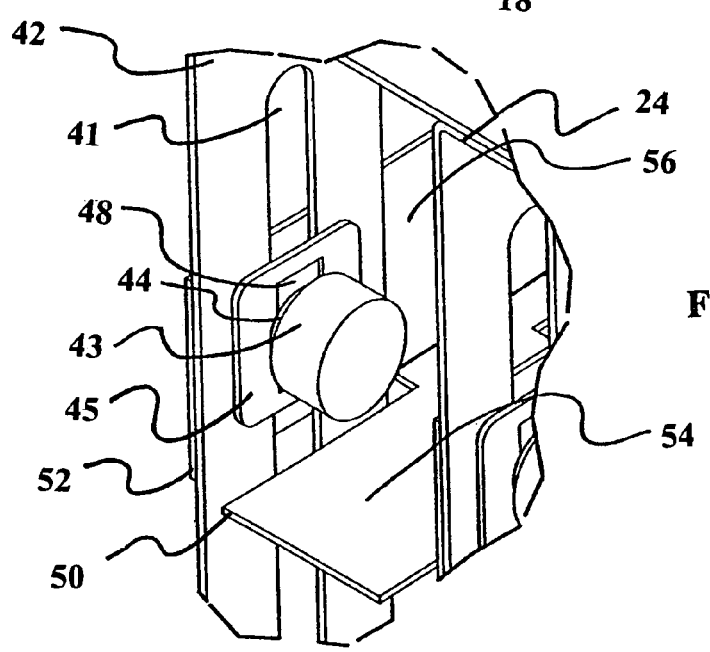
FIG. 2 is a detailed view of an adjustment structure for one of the cells of the circuit board carrier of FIG. 1.
Figure 3:
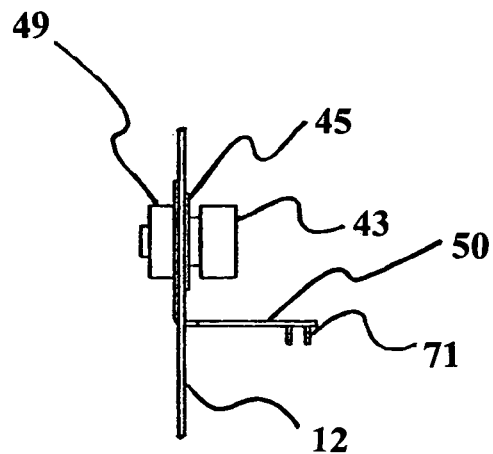
FIG. 3 is an end view of the adjustment structure of FIG. 2.
Figure 4:
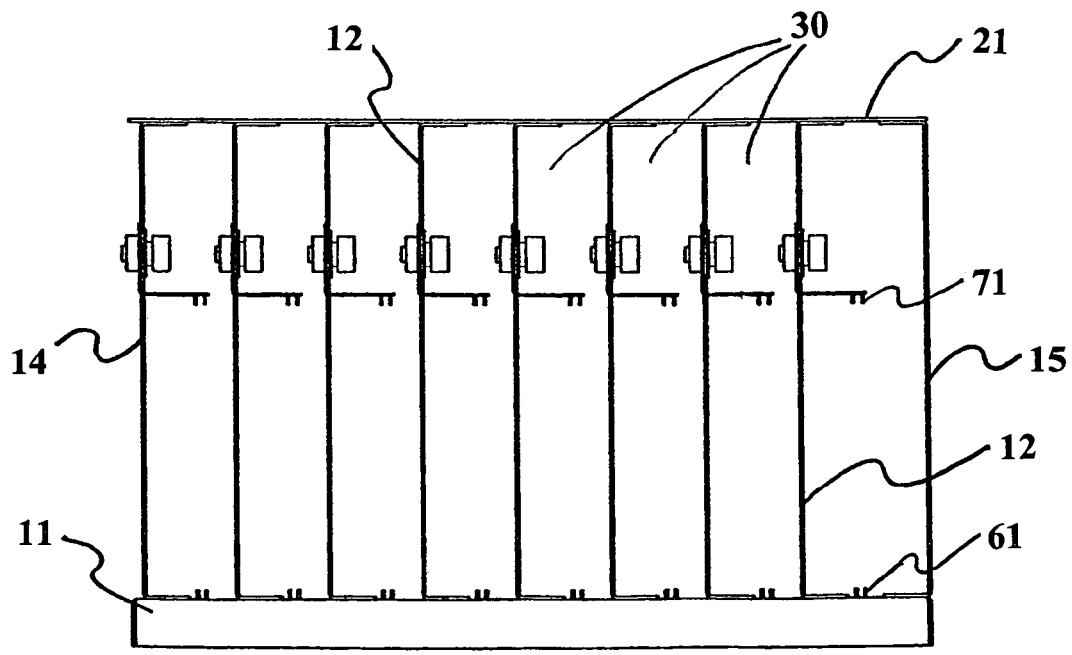
FIG. 4 is a side view of the circuit board carrier of FIG. 1.

FIGS. 1–4 show a circuit board carrier 10 according to an exemplary embodiment of the invention. A shelf 11 is formed of a lightweight yet strong material such as aluminum and has a rectangular peripheral shape. Side brackets 12 are positioned in a row along opposite lengthwise top edges of the shelf 11. The side brackets 12 are formed in an "L" shape. The bottom portion 13 of the end-most side bracket 15 facing inwards so that the outer-face 18 of an outer bracket 15 may be made approximately flush with an end face 16 of the shelf 11. The side brackets 12, 14, 15 are attached at their respective bottoms 17, 13 to the shelf 11 with suitable fasteners such as rivets, welds, bolts, washers, and nuts, or other suitable fastening system such as spring metal inserts, twist fasteners, etc. Although sections of the carrier 10 may be described only with reference to one side of the carrier 10, it is understood that a preferable application has a symmetrical structure when practicable.

Top brackets 21, 22 are each formed with a length approximately the same as the length dimension of the shelf 11. One or both of the end-most side brackets 14, 15 along each of the carrier sides may be formed as an integral part of the respective top bracket 21 by simply bending the top bracket 21 at ninety degrees at the length-end portions. Any of the top brackets 21, 22 or end-most side brackets 14, 15 may optionally have attached a handle or other device for carrying the carrier 10, and/or may have slots or other suitable structure for simplifying a manufacturing or testing process, for example, by providing a location for gripping or securing the carrier 10 to a rack, etc.

The side brackets 12, 14, 15 may be positioned along the length of the shelf 11 at regular intervals so that the side brackets 12, 14, 15 are parallel and provide regularly dimensioned cells 30 adjacent one another. The carrier 10 may have the side brackets 12, 14, 15 permanently fixed at lateral locations by welding, rivets, or similar method for securing the respective bottom portion 17, 13 to the shelf 11. Similarly, side brackets 12, 14, 15 each have an upper lateral portion 24 for securing the side bracket 12, 14, 15 to the corresponding top bracket 21 or 22 by use of a same welding, riveting, or similar method. Optionally, the shelf 11 may be provided with multiple mounting holes at each potential side bracket location, so that the user may create cells 30 having different lateral dimensions by securing respective ones of the side brackets 12, 14, 15 in chosen ones of the multiple holes. Alternatively, mounting hole(s) 28, 29 of a bottom portion 17, 13 may be elongated so the user is able to slide the side brackets 12, 14, 15 laterally and tighten the side brackets 12, 14, 15 at a desired lateral location.

The side brackets 12, 14, 15 each have a lengthwise vertical slot 41 located in the middle portion of long bracket face 42. As shown, card guide bracket 50 includes horizontal portion 54 and vertical portion 56. Card guide bracket 50 may be secured at its lengthwise ends to opposing side brackets 12, 112. For example, at each end of card guide bracket 50 a thumbscrew 43 has a threaded member that passes through round washer 44 and square washer 45 via square washer slot 48. The thumbscrew 43 threaded member then passes through vertical portion 52 of card guide bracket 50 and is threaded into a t-slot nut 49 inserted into a rectangular hole in vertical portion 52 of card guide bracket 50. T-slot nut 49 may also extend laterally into square washer 48. When thumbscrews 43 at each end of card guide bracket 50 are loose, the user may move card guide bracket 50 to a desired vertical position and then tighten thumbscrews 43 to fix the card guide bracket 50 at such location. Various structures may be used for securing a card guide bracket 50 at an upper position including a wedge nut, a releasing clip, and others.

One alternate structure may employ known T-slotted rails as side brackets, thereby providing a system that may secure a nut or other fastener to avoid a possibility of the nut working loose and detaching from a carrier 10. The side brackets 12, 14, 15 may have incremental markings that provide a structure for determining a vertical height of card guide bracket 50. For example, a ruler type straight edge on long bracket face 42 may be used for assuring that card guide bracket 50 is at a same vertical height at each of its ends, and a height of a card guide bracket 50 may be recorded by the user for documenting the test setup.

Lower card guides 61 are located on top surface 19 of shelf 11 and are positioned to be perpendicular to the lengthwise axis of shelf 11. In this exemplary embodiment, two lower card guides 61 are located at a linear position within a given cell 30 so that a circuit board may be inserted into cell 30 with its circuit board edge engaged with lower card guides 30. Upper card guides 71 are located at an underside of each of card guide brackets 50 and are positioned to be directly above the corresponding lower card guides 61. As such, card guides 61, 71 have a structure where the circuit board under test ("UUT") is oriented perpendicularly with respect to upper surface 19 of shelf 11. When installing such UUT, it may be advantageous to slightly loosen card guide bracket 50 by loosening the corresponding pair of thumb screws 43 and then by subsequently tightening thumb screws 43 while pressing down slightly on card guide bracket 50, the UUT may be snugly secured between the card guides 61, 71. In such a case, manufacturing deviations in a width of the UUT are obviated by a structure that assures a snug fit. This is especially important for accurately controlling the test environment. For example, when the carrier is placed on a vibration table or similar apparatus, the snug fit of the UUTs in carrier 10 provides for accurate vibration of the UUT. Similarly, by snugly fitting the UUTs in the carrier 10, the UUTs are protected from shifting damage caused by movement of the carrier within the manufacturing area such as, for example, by being loaded onto carts. For example, by snugly fitting the UUTs within carrier 10, a chance of individual UUTs falling out of the carrier and being damaged is greatly reduced.

Electrical or optical connectors may be provided in a carrier 10 for interfacing electrical power, loads, and/or test connections to individual circuit boards such as, for example, by using known edge card connectors (not shown) that are wired to a female multi-prong electrical connector located on an exterior face of the carrier 10. Various configurations for providing electrical or optical connection to individual circuit boards in a carrier are known. For example, U.S. Pat. No. 5,528,161 granted to Liken et al., herein incorporated by reference, discloses a carrier adapted for electrical connections. In another example, cables and circuit board connector systems such as those disclosed for use in automated test equipment (ATE) in U.S. Pat. No. 6,462,532 granted to Smith, incorporated by reference, may be adapted for providing interconnection between circuit boards loaded into a carrier 10. The invention is intended to be adaptable to any given electrical and/or optical connections requirements of a particular circuit board application.

In addition, the ability to individually adjust dimensions of a test cell 30 allows for testing and functional operation cycling of groups of circuit boards. Such a group may utilize electrical or optical interconnection between individual circuit boards along shelf 11. For example, circuit boards of different types and sizes may be installed in adjacent cells 30 and may have cables or optical paths interconnecting the circuit boards. In such manner, the circuit boards may be functionally adjusted with respect to one another and may be tested and cycled as a group. Such a group, for example, may be in a master-slave configuration, may be tuned for a particular performance criteria (e.g., frequency related, resonance, mutual reactance properties, matched pair, mutual timing requirements, etc.), may depend on data transfer or other communication from one circuit board to another, may be logically interconnected, may require simultaneous parametric testing, etc. Another example of cooperation between separate circuit boards loaded into carrier 10 includes communicating of electrical information for calibrating a performance of at least one of the circuit boards of a group. Many other applications exist for treating circuit boards as a group in a performance testing, operation, and/or adjustment or calibration process. By providing for individually adjusting a card guide bracket 50 to snugly fit a circuit board of various width, carrier 10 uniquely provides for burn-in and testing of cooperating circuit boards having different physical dimensions and thereby provides a higher quality for a final assembly that includes the circuit boards of a group.

It may be advantageous to provide maximum air flow through carrier 10 so that a uniform heat and humidity condition exists for individual UUTs. Various factors include heating and air circulation properties of a chamber, room, test rack, or other, self-heating of the UUT, radiation properties and surface areas of materials and structures, electrical power dissipation, size of a volume occupied by a UUT, etc. By reducing the area of surfaces of carrier 10 near the UUTs, the air circulation is improved. Shelf 11 is formed with cutouts 67 in a central portion of the main shelf surface 19. The cutout areas 68 are separated by strips 62 on which the lower card guides 61 are located. Similarly, the card guide brackets 50 have cutout areas 58 that provide for air circulation while maintaining structural strength of the carrier assembly 10. It will be understood that control of various aspects of a carrier such as, for example, air flow is important for control of heating, cooling, humidity, altitude/pressure conditions, etc., in a stress chamber or other manufacturing type process. Greater accuracy of testing and burn-in is achieved, obtaining tighter uniformity throughout the chamber for consistent stress on products being tested.

As a result of providing independently adjustable cells 30 of a circuit board carrier 10, deviations in width of a circuit board being carried by carrier 10 may be accounted-for by loosening and re-tightening card guide brackets 50 to snug the card guides 61, 71 against the circuit board, thereby preventing movement of the circuit board within carrier 10. Although bare printed circuit boards may be supplied with a very small tolerance for size variation, various effects of assembling the circuit board may slightly change its dimensions such as, for example, solder adhering to a location near a circuit board edge being engaged by a card guide 61, 71, slight warping of the circuit board due to wave soldering, cleaning, or other manufacturing process, etc.

Figure 5:
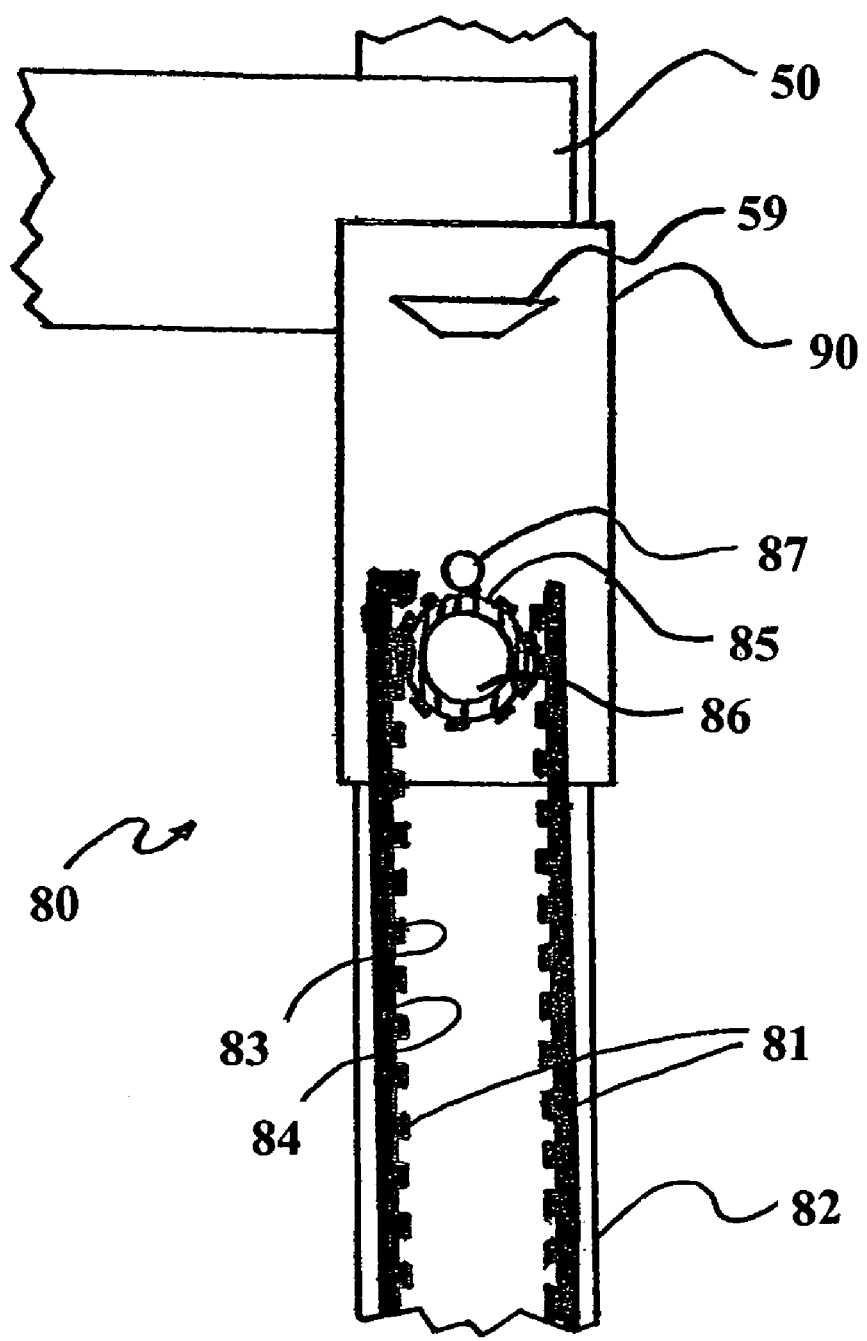
FIG. 5 is a schematic side view of an alignment mechanism utilized in an alternative structure for individually adjusting a height of a card guide for one of the cells of a circuit board carrier according to an exemplary embodiment of the invention.

Another example for assuring that a card guide bracket is at a same vertical height at each of its ends is a structure that includes an alignment mechanism 80 such as a gear and track. As shown in FIG. 5, each side bracket 82 of a cell 30 has a pair of opposing track-like surfaces 81 that engage a gear wheel 85 located in an adjusting block 90. The track-like surface 81 is formed of a series of alternating projections 83 and grooves 84. A thumb wheel (not shown) is attached to a shaft 86 and is adapted to be easily turned by a user, so that gear wheel 85 moves up or down side bracket 82 along tracks 81. Such vertical movement of gear wheel 85 carries associated adjusting block 90 and card guide bracket 50 up or down with respect to side bracket 82. Side bracket 82 on each end of a cell 30 has the gear and track structure, assuring the corresponding card guide bracket 50, connected at an end portion 59 thereof to the respective adjusting block 90, is kept parallel to bottom card guides 61 and top surface 19 of shelf 11. In such manner, upper card guide 71 may be maintained parallel to top surface 19 of shelf 11.

A locking member 87 prevents rotation of gear wheel 85 when locking member 87 is engaged. Different types of mechanisms may be employed as a locking member 87 including, for example, a spring-loaded pin device, a set screw, a latch, a lever arm, etc. FIG. 5 shows gear wheel 85 at an uppermost position with respect to side bracket 82, the alignment mechanism 80 being structured to prevent gear wheel 85 from disengaging from tread 81 if a user attempts to raise the card guide bracket 50 too high. Optionally, side bracket 82 may include a single track surface 81 rather than a pair of track surfaces 81. Various other apparatus may be used for aligning or measuring a height of the upper card guide 71, such as by utilizing shafts and releasable slider devices (not shown) in place of the side brackets 82 and alignment mechanisms 80. Such releasable sliders may be structured for allowing a simple squeezing or twisting action to release a slider for sliding movement along the respective shaft. By engraving ruler type markings along the shaft, accurate documentation of the card guide setup may be effected.

The aligning type structure of FIG. 5 differs from a non-aligning structure since a non-aligning structure allows one end of card guide bracket 50 to be at a different vertical height compared to the other end of the card guide bracket 50, whereas the aligning structure maintains a same vertical height for the respective two opposite ends. As a result, a structure such as a FIG. 1 type apparatus adapted to be a non-aligning structure provides a user with the capability to snugly fit the card guides 61, 71 to a circuit board having an irregular width, whereas the aligning structure of FIG. 5 allows a user to assure parallel orientation of card guides 61, 71. Particular advantages exist for both an aligning structure and a non-aligning structure, for example setting an aligned vertical height to a predetermined setting may assure a controlled test setup without a need to further tighten or loosen a locking device 87 or as shown in the FIG. 2 embodiment. The aligning structure may be easier to configure for a user desiring to quickly modify a carrier 10 for different groups of circuit boards having different dimensions.

A preferred burn-in/test system combines an environmental chamber for temperature and other conditioning and a functional test system to weed out bad products. Products that are loaded into such a chamber may be subjected to elevated/reduced temperatures and other environmental conditions, stressed by varying a load power and/or input voltage to a UUT, and subjected to various stimuli. State-of-the-art environmental and testing systems are available from Thermotron Industries of Holland, Mich. A chamber may itself have shelves adapted for installing ones of carrier 10 loaded with UUTs, or may be structured for receiving carts or other transporting apparatus (not shown) adapted for holding a number of individual carriers 10. Electrical connections to individual carriers 10 may be made via one or more levels of connectors, for example, high-temperature rated military style connectors connecting to wiring harnesses and/or various modules including wiring modules, load modules, etc.

Depending on a particular application, the shelf 11, side brackets 12, 14, 15, 82 and/or top brackets 21, 22 may be adapted for being transported by a conveyor belt, cart, trolley, hook, etc. For example, when a cart used in a particular environmental chamber has a structure of an "angle-iron" type frame (see, e.g., U.S. Pat. No. 4,683,424, at FIG. 5) with fixed dimensions between adjacent frame members, a carrier 10 may be adapted to fit between opposing angled frame members so that carrier 10 is adapted to the angled frame members as spaced-apart guide tracks for being installed or removed from the cart. In such a case, extension members (not shown) may be bolted on or otherwise attached to an appropriate part of the carrier 10 structure for providing the carrier 10 with a correct lengthwise, widthwise, or height dimension. Such a structure is thereby adapted for being customized for a particular transport and/or manufacturing type apparatus. Since the carrier 10 is able to snugly hold circuit boards, a manufacturing process may transport carrier 10 without causing transport damage to or dropping of the individual circuit boards.

The present inventor has determined that it is beneficial to snugly fit circuit boards of various dimensions on a single carrier shelf, to reduce potential handling damage, provide tighter control over circuit board manufacturing, better facilitate controlled vibration testing without allowing a flopping around of a circuit board under test, allow for interconnection of different circuit boards on a carrier shelf for performing live testing and calibration of circuit boards used as a group, for providing easily adaptable circuit board fixturing, etc.

While the principles of the invention have been shown and described in connection with specific embodiments, it is to be understood that such embodiments are by way of example and are not limiting.

What is claimed is:

1. A circuit board carrier, comprising:
a plurality of circuit board carrying positions, each position comprising:
a pair of fixed brackets having longitudinal axes essentially in parallel with one another;
a pair of opposed card guides each having an elongate groove, the elongate grooves of the opposed card guides facing one another for respectively holding opposite edges of a circuit board, the elongate grooves being essentially orthogonal to the parallel axes of the fixed brackets;

a card guide bracket holding one of the card guides, the card guide bracket having opposite ends adjustably connected to respective brackets of the pair of brackets; and a pair of adjustment members respectively disposed on opposite ones of the pair of fixed brackets, the pair of adjustment members being ganged together by the card guide bracket, the pair of adjustment members being structured for changing a distance between the pair of opposed card guides.

2. The circuit board carrier of claim 1, wherein the pair of adjustment members comprises at least one securing mechanism structured to fix the position of the card guide bracket at a selected position along the longitudinal axes of the pair of fixed brackets.

3. The circuit board carrier of claim 2, wherein the pair of fixed brackets includes at least one slotted rail, and wherein the securing mechanism is structured to fix a location of the card guide bracket along the at least one slotted rail.

4. The circuit board carrier of claim 3, wherein the securing mechanism includes:

at least one threaded member that extends through a slot of the slotted rail; and a threaded nut for receiving the threaded member.

5. The circuit board carrier of claim 4, wherein the threaded nut is one of a T-slot nut and a wedge nut.

6. The circuit board carrier of claim 3, wherein the at least one slotted rail includes at least one T-slotted rail.

7. The circuit board carrier of claim 2, wherein at least one bracket of the pair of fixed brackets includes a rack and pinion.

8. The circuit board carrier of claim 2, wherein the at least one bracket of the pair of brackets includes a shaft, and wherein the securing mechanism includes a slide member slidingly disposed on the shaft.

9. The circuit board carrier of claim 8, wherein the slide member includes a spring-loaded release mechanism.

10. The circuit board carrier of claim 1, wherein at least one bracket of the pair of fixed brackets includes graduations along a line in parallel with the longitudinal axes of the pair of fixed brackets.

11. The circuit board carrier of claim 1, further comprising a structural frame for rigidly connecting together the plurality of circuit board carrying positions.

12. The circuit board carrier of claim 11, further comprising at least one handle connected to the structural frame.

13. A method of carrying a plurality of circuit boards, comprising:

providing a plurality of circuit board carrying positions, each position comprising:

a pair of fixed brackets having longitudinal axes essentially in parallel with one another;

a pair of opposed card guides each having an elongate groove, the elongate grooves of the opposed card guides facing one another for respectively holding opposite edges of a circuit board, the elongate grooves being essentially orthogonal to the parallel axes of the fixed brackets;

a card guide bracket holding one of the card guides, the card guide bracket having opposite ends adjustably connected to respective brackets of the pair of brackets; and a pair of adjustment members respectively disposed on opposite ones of the pair of fixed brackets, the pair of adjustment members being ganged together by the card guide bracket, the pair of adjustment members being structured for changing a distance between the pair of opposed card guides.

14. The method of claim 13, wherein each circuit board carrying position further comprises at least one securing mechanism structured to fix the position of the card guide bracket at a selected position along the longitudinal axes of the pair of fixed brackets.

15. The method of claim 14, further comprising:

placing a first circuit board in the elongate groove of one of the opposed card guides of a first circuit board carrying position of the plurality of circuit board carrying positions, adjusting the card guide bracket position so that the first circuit board is snugly held between the elongate grooves of the corresponding pair of opposed card guides, and fixing the position of the card guide bracket at the snugly held position using the corresponding securing mechanism;

placing a second circuit board in the elongate groove of one of the opposed card guides of a second circuit board carrying position of the plurality of circuit board carrying positions, adjusting the card guide bracket position so that the first circuit board is snugly held between the elongate grooves of the corresponding pair of opposed card guides, and fixing the position of the card guide bracket at the snugly held position using the corresponding securing mechanism, wherein the respective distances between the opposed card guides of the first and second circuit board carrying positions, in the snugly held positions, is different.

\* \* \* \* \*